United States Patent
Pant et al.

(10) Patent No.: US 7,227,384 B2
(45) Date of Patent: Jun. 5, 2007

(54) SCAN FRIENDLY DOMINO EXIT AND DOMINO ENTRY SEQUENTIAL CIRCUITS

(75) Inventors: Mondira Pant, Westborough, MA (US); Paul Gronowski, Northborough, MA (US); Randy Allmon, North Grafton, MA (US); Manjunath Bhat, Sunnyvale, CA (US); David Lin, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 159 days.

(21) Appl. No.: 11/201,559

(22) Filed: Aug. 11, 2005

(65) Prior Publication Data

US 2007/0035331 A1    Feb. 15, 2007

(51) Int. Cl.
   *H03K 19/20* (2006.01)
(52) U.S. Cl. ......................................... 326/112; 326/93
(58) Field of Classification Search ............ 326/93–98, 326/112, 119, 121; 714/726, 727
   See application file for complete search history.

(56) References Cited

U.S. PATENT DOCUMENTS 6,329,867 B1 *  12/2001  Penney et al. .............. 327/392
6,356,107 B1 *   3/2002  Tang et al. .................... 326/40
6,456,115 B2 *   9/2002  Li et al. ........................ 326/95
6,522,171 B2 *   2/2003  Hanson et al. ................ 326/95
6,563,343 B1 *   5/2003  Patel et al. ................... 326/87
2006/0006900 A1 *  1/2006  Kinkade et al. .............. 326/16
2006/0244486 A1 * 11/2006  Ruesch ........................ 326/57

* cited by examiner

*Primary Examiner*—Don Le
(74) *Attorney, Agent, or Firm*—Lee & Hayes, PLLC

(57) ABSTRACT

A circuit for converting received domino logic signals to a static output signal includes a pair of logic gates having inputs and outputs that are cross-coupled and responsive to a domino logic input signal and a clock signal to latch the input signal during an evaluation phase defined by the clock signal. A static output is based on the latched value. One of the logic gates is tri-stateable to establish a value at the static output during a scan mode. A circuit for converting received static logic signals into domino logic signals includes a latch responsive to a clock signal to latch the value of a data signal at a predefined clock transition. A conversion circuit produces a domino logic output signal in response to the clock signal and the latched value of the data signal. A latch component is tri-stateable to establish a value at the output.

29 Claims, 10 Drawing Sheets

Prior Art

Prior Art

Prior Art

Prior Art

SCAN FRIENDLY DOMINO EXIT AND DOMINO ENTRY SEQUENTIAL CIRCUITS

TECHNICAL FIELD

This invention relates to fast domino-exit and domino-entry circuits, and more particularly, to making such circuits scan friendly.

BACKGROUND

So-called "domino" logic circuits are often used in semiconductors because of their superior speed and area characteristics as compared to static circuits.

FIG. 1 shows a generic example of a domino logic circuit 10. Input signals comprise a clock signal CLK and one or more inputs I. It will be understood that the clock signal CLK may be a square wave or a regularly oscillating signal. An output O is driven by an inverter 11. The input of inverter 11 is driven by an intermediate node 12. A pullup transistor 13 raises node 12 to Vdd when CLK is low.

Operation of circuit 10 occurs in two phases: a precharge phase and an evaluation phase. The precharge phase occurs when CLK is low. During this phase, pullup transistor 13 is on, and node 12 is charged to high. Output O, comprising the output of inverter 11, is therefore low. A keeper transistor 14 is gated by O, and pulls node 12 high whenever output O is low.

The evaluation phase occurs when CLK goes high and pullup transistor 13 is turned off. In this phase, a lower transistor 15 is turned on, enabling a pull-down network 16. The pull-down network 16 is responsive to inputs I to potentially pull down node 12, depending on the state of inputs I. In the situation where pull-down network 16 does not pull node 12 low, keeper transistor 14 maintains node 12 at a high level, and output O is therefore maintained at a low level.

Domino logic circuits such as this, also referred to as "sequentials," are often chained in real-world circuits. That is, the output of one such circuit is connected to the input of another. When developing and debugging circuits such as these, it is desirable to be able to read each output and also to set each output to an arbitrary state. This is often accomplished by the use of so-called "scan" circuitry.

FIG. 2 shows a simplified example of how such scan circuits work in conjunction with domino logic circuits. This example includes a plurality of domino logic circuits 18, with outputs chained to inputs of succeeding logic circuits. A scan circuit 19 is associated with each logic circuit 18. Each scan circuit 19 has a scan data connection 20 to the output of the associated logic circuit 18. If desired to read the outputs of the logic circuits, the scan circuits 19 are configured to act in unison to read and store all output values. Subsequently, the stored output values are shifted serially through each scan circuit 19 to a single output pin.

If desired to write or set the outputs, the desired values are first shifted serially into the scan circuits 19. Then, a scan line 21 is asserted from each scan circuit 19 to each corresponding logic circuit 18. This causes the logic circuit 18 to tri-state its output. The scan data connections 20 are then set at the desired levels. Operation of the overall circuit can then be initiated from this known start point.

FIG. 3 shows how the domino logic circuit of FIG. 1 is modified for use with the scan circuits of FIG. 2. The circuit of FIG. 3 is the same as that of FIG. 1, except that a scan line SC is added as an input to inverter 11. Inverter 11 is configured to tri-state its output in response to scan line SC.

It is often the case that domino logic interfaces with static logic circuits or elements. In a static logic circuit, the output is expected to change only at a given clock transition, and to then remain valid and stable until a subsequent clock transition.

FIG. 4 shows a prior art circuit 30 that interfaces between domino logic and static logic. Circuit 30 receives domino logic signals as its input, and produces a signal that is compatible with static logic. This type of circuit is referred to as a "domino-exit" circuit.

The circuit 30 includes two portions: a dynamic signal receiver portion 31 and an output driver portion 32. The dynamic signal receiver portion 31 includes a PMOS transistor 106, an NMOS transistor 108 and an NMOS transistor 110 coupled in series between Vcc and Vss. The gates of the PMOS transistor 106 and the NMOS transistor 108 are coupled to a line IN_H, while the gate of the NMOS transistor 110 is coupled to line CLK. In addition, the drain of NMOS transistor 110 and the source of NMOS transistor 108 are coupled to a line 112.

The output driver portion 32 of circuit 30 includes a PMOS keeper transistor 114 with its source connected to Vcc and its drain connected to memory node 115. Line OUT_L as well as an input to a tri-stateable inverter 116 are also coupled to OUT_L. The inverter 116 can be tri-stated by a low signal applied to line SCA. It will also be understood that the inverter 116 could be tri-stated by a high signal or by complementary signals.

The output of inverter 116 is applied to (1) the gate of PMOS keeper transistor 114, (2) the gate of an NMOS transistor 118, and (3) scan line IN_OUT. The source of NMOS transistor 118 is coupled to Vss, while the drain is coupled to line 112.

Circuit 30 can operate in a precharge phase and an evaluation phase. During the precharge phase, line CLK is held low while line IN_H is high. As a result PMOS transistor 106 and NMOS transistor 110 are turned off, thus precluding signal receiver portion 31 from having any influence over the output driver portion 32.

During the precharge phase, it is possible for scan circuitry to read or change the value stored on the memory node 115. For example, in order to read the value latched on the output driver portion 32, the diagnostic testing circuit 102 need only read the value applied to the line IN_OUT. This value will be the complement of that stored on the memory node 115.

In order to write a new value to be latched on the memory node 115, a low signal may be applied to line SCA, resulting in the inverter 116 being tri-stated. Once this occurs, the value sought to be latched to the memory node 115 may be applied to the line IN_OUT. Line SCA may then be raised, and the driver portion 32 will maintain this new value.

During the evaluation phase, line CLK delivers a high signal, while line IN_H may be either high or low to indicate a data value. In this situation, transistors 106 and 108 act as an inverter to drive node 115 (and output OUT_L) to a value that is complementary to that of input line IN_H, and to potentially change the value at node 115.

Operation of this circuit relies on the relative sizes or impedances of the receiver circuits and the driver circuits. Specifically, the receiver circuits are relatively bigger than the driver circuits so that the receiver can effectively overwrite the feedback loop present without driver portion 32.

FIG. 5 shows a prior art representation of a circuit 200 that interfaces between static logic and domino logic. Circuit 200 receives a static logic signal at its input and produces signals compatible with domino logic. This type of circuit is referred to as a "domino-entry" circuit. The circuit 200 includes two sub circuits—a capture latch 201 and a domino converter 202. Capture latch 201 includes a PMOS pullup transistor 203, and NMOS pulldown transistors 204, 206, 208 connected in series between Vcc and Vss. A line CLK is coupled to the gates of PMOS transistor 203 and NMOS transistor 204. Line CLK is also connected to NMOS transistor 208 through an inverter 210. A line IN_H is coupled to the gate of NMOS transistor 206.

Domino converter 202 includes a latch formed by a cross-coupled inverter pair 212, 214. A latch node 216 couples the domino converter 202 to the capture latch 201.

Circuit 200 can operate in a precharge phase and an evaluation phase. During a precharge phase, line CLK is low. This turns on pullup transistor 203 and turns off pull down transistor 204. As a result, a high signal is coupled to the inverter pair 212, 214 and a low signal is applied to line OUT.

During an evaluation phase, line CLK is asserted high, turning off pullup transistor 203 and turning on pull down transistor 204. Also, since a propagation delay is encountered at the inverter 210 before a low signal is coupled to PMOS 208, there exists a finite period in which both gates 204 and 208 are turned on. Thus, if line IN_H is asserted high, then NMOS transistor 206 is turned on, and a low signal pulse from Vss is coupled through NMOS transistors 208, 206, 204 to latch node 216. The signal pulse is then inverted to a high signal by inverter 212 before being applied to line OUT.

Alternately, if a low signal is applied to line IN_H, NMOS transistor 206 is turned off. Thus Vcc and Vss in capture latch 201 are decoupled from the input node 216 and the value latched in the cross-coupled inverter pair 212, 214 is output on line OUT.

BRIEF DESCRIPTION OF THE DRAWINGS

The detailed description is described with reference to the accompanying figures. The use of the same reference numbers in different figures indicates similar or identical items.

DETAILED DESCRIPTION

Domino Exit Sequentials

Figure 6:
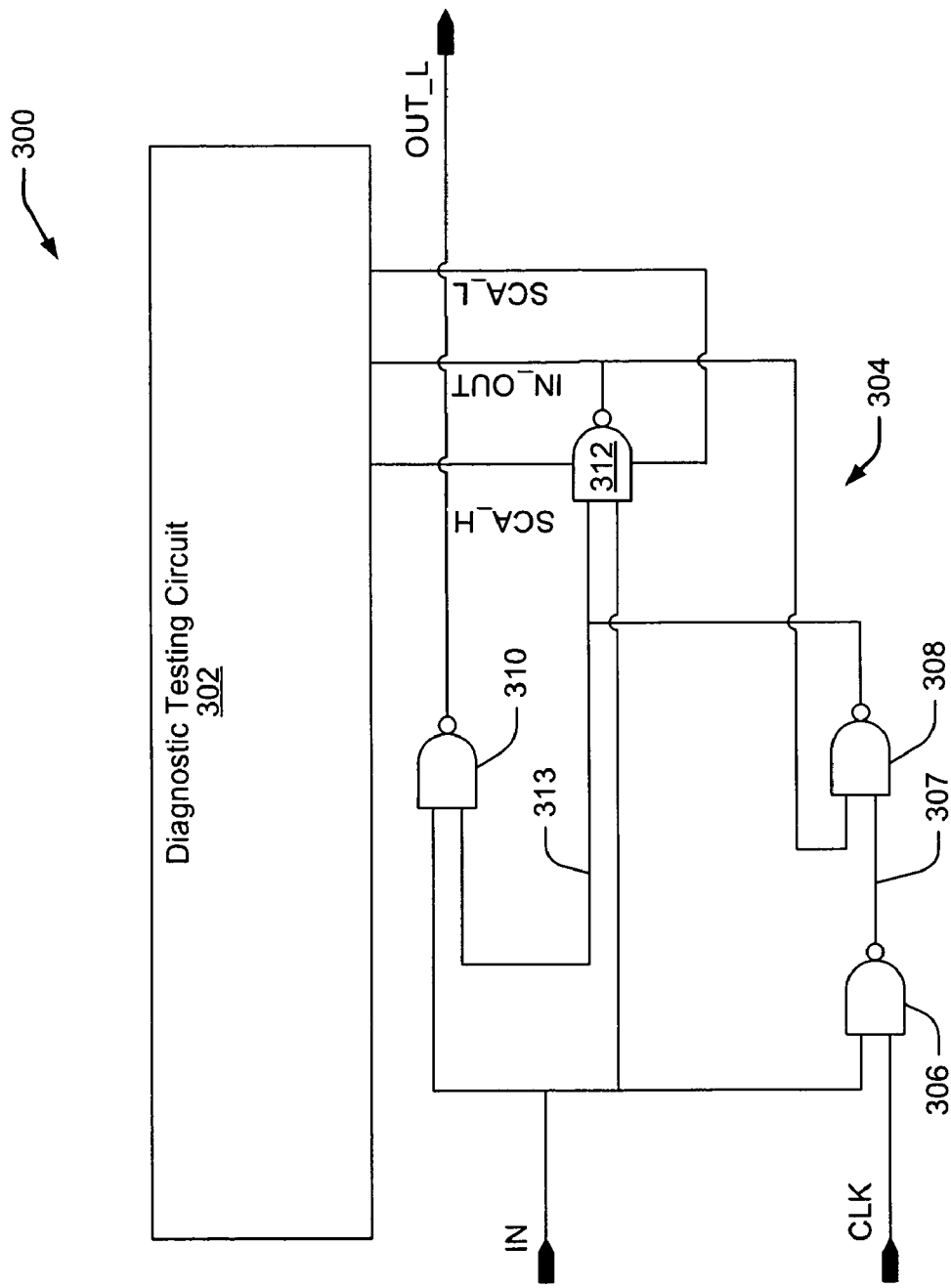
FIG. 6 shows an exemplary scanning environment for a scan-friendly domino-exit sequential.

FIG. 6 shows an exemplary scanning environment 300 including a diagnostic testing circuit 302 in communication with a scan-friendly domino-exit circuit 304. Exit circuit 304 receives a domino-logic signal and in response produces a static logic signal. As explained above, a domino logic signal comprises a data signal and a clock signal, and the data signal is valid only during one phase of the clock cycle. In a static logic signal, the data signal is valid and stable during both phases of the clock cycle.

Circuit 304 includes a two input NAND gate 306 which receives inputs from a line CLK at a first input, and a line IN at a second input. The output of gate 306 (node 307) is applied to a first input of a two input NAND gate 308. A second input to gate 308 is received from line IN_OUT. Two other two input NAND gates are included in the circuit 304: a two input NAND gate 310 and a two input tri-stateable NAND gate 312. Both of these gates 310, 312 share the same inputs, namely the output from gate 308 (i.e. output node 313) and a signal from line IN. The output of gate 310 is applied to line OUT_L, while the output of gate 312 is applied to line IN_OUT, effectively becoming the second input to gate 308. Gate 312 is tri-stateable by complementary signals on lines SCA_H and SCA_L. It will be understood, however, that gate 312 could alternately be tri-stateable by a single low signal, or a single high signal.

Gates 312 and 308 thus have cross-coupled inputs and outputs: the output of gate 312 is connected to the second input of gate 308, and the output of gate 308 is connected to a first input of gate 312. This results in an R-S latch memory element that can be set or reset by the remaining inputs of gates 312 and 308.

Gates 308 and 312 may be interchanged in the circuit 304 shown in FIG. 6, without any change in the functionality or usability of the circuit. In other words, similar functionality can be achieved regardless of which of these gates is tri-stateable. It will also be understood that the R-S latch formed by gates 308 and 312 could also be constructed using other logic gates, such as NOR gates.

In normal operation, circuit 304 functions in a precharge phase and an evaluation phase. The precharge phase is defined by CLK being low. In addition, line IN is held high during the precharge phase. During the precharge phase, when CLK is low and IN is high, the output of gate 306 is high. Thus, at least one input to gate 312 and gate 308 is high. In such an instance, gate 308 and gate 312 perform as inverters, outputting the complement of whatever signal is received at their other input and together forming a latch.

The evaluation phase is defined by CLK being high. As noted above, it will be understood that the clock signal CLK may be a square wave or a regularly oscillating signal. Line IN is valid during this phase and can be either high or low, depending on the data value it is intended to convey. When line IN is high, circuit 304 will output a low signal. Alternately, if line IN is held low in the evaluation phase, then a high signal will be output on line OUT_L.

The circuit can also operate in a scan mode. In scan mode, diagnostic testing circuit 302 either reads data output from circuit 304 or writes data to the output of circuit 304. To write data to the output, signals are communicated between the diagnostic testing circuit 302 and the circuit 304 over lines SCA_H, SCA_L and IN_OUT during the precharge phase defined by CLK (when CLK is low). More specifically, in order to write a value to node 313, a low signal is applied to line SCA_L and a complementary high signal is applied to line SCA_H to tri-state the tri-stateable NAND gate 312. Once this occurs, the value sought to be written is applied to line IN_OUT. A high signal asserted on line IN_OUT will result in a low signal being placed on node 313 and a high signal being output on line OUT_L. Alternately, a low signal asserted on line IN_OUT, will result in a high signal being placed on node 313 and a low signal being output on line OUT_L. Line SCA_L may then be raised—and line SCA_H lowered—and the output node 313 will maintain its new value.

In contrast, in order to read from the circuit 304, the gate 312 does not need to be tri-stated. Rather the value on node 313 can be read directly into diagnostic testing circuit 302 on line IN_OUT.

Gate 310 functions as a look aside NAND gate and gives circuit 304 the potential to drive large gates. Moreover, the line OUT_L is always positively driven by gate 310 during both precharge and evaluation phases. In addition, the presence of gate 310 provides isolation between line OUT_L and the cross-coupled NAND gates 312 and 308. This isolation provides additional protection to values being stored on the cross-coupled NAND gates 308, 312 from degradation or corruption resulting from noise which may be asserted on line OUT_L.

It should also be noticed that even though line IN is only one gate delay away from line OUT_L, line CLK is three gate delays away from line OUT_L. This prevents the circuit 304 from experiencing deleterious clock loading at line OUT_L.

It will also be understood that when used with circuit 304, diagnostic testing circuit 302 may be a bolt-on module with sizing that is relatively insensitive to the output drive ability of the sequentials to which it may be coupled. Hence diagnostic testing circuit 302 may be shared across a wide variety of drive strengths on various sequential families.

Figure 7:
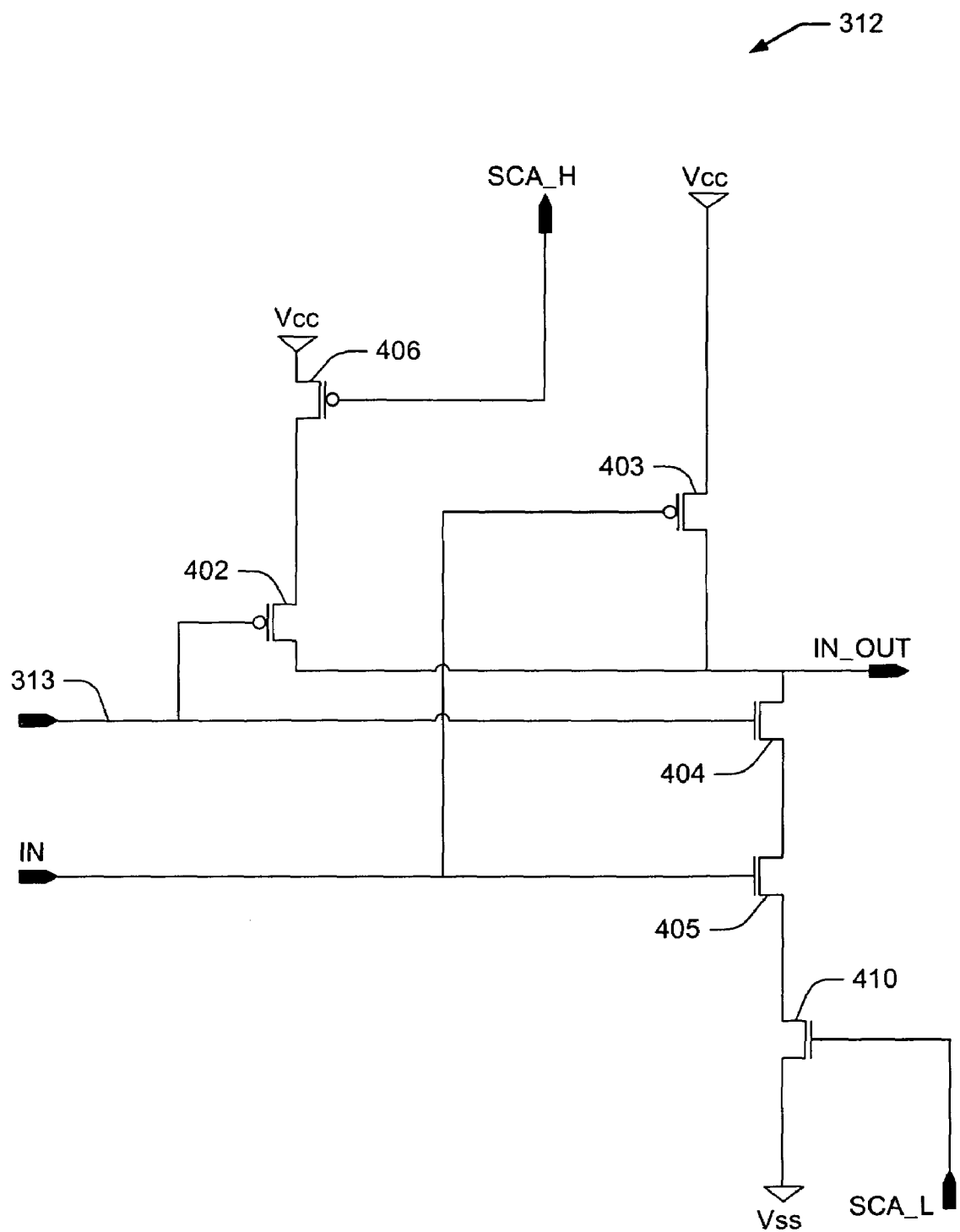
FIG. 7 illustrates the 2 input tri-stateable NAND gate 312 shown in FIG. 6.

FIG. 7 shows implementation details of the 2 input tri-stateable NAND gate 312 introduced in FIG. 6. As shown, NAND gate 312 includes an array of two PMOS pullup transistors 402 and 403, connected in parallel to line IN_OUT to pull line IN-OUT high whenever either of line IN or node 313 carries a low signal. In addition, NAND gate 312 includes a stack of NMOS pull-down transistors 404 and 405 connected in series to pull line IN_OUT low whenever both of line IN and node 313 carry high signals.

Output node 313 communicates the output of gate 308 to the gates of a PMOS pullup transistor 402 and a NMOS pulldown transistor 404. The drain of the PMOS transistor 402 is coupled to line IN_OUT, while the source of the PMOS transistor 402 is coupled to the drain of a PMOS pullup transistor 406. The source of the PMOS pullup transistor 406 is coupled to Vcc while the gate of the PMOS pullup transistor 406 is coupled to line SCA_H.

In addition to having node 313 coupled to its gate, NMOS pulldown transistor 404 has line IN_OUT coupled to its drain. The source of NMOS pulldown transistor 404 is coupled to the drain of NMOS pulldown transistor 405. Moreover, the gate of NMOS pulldown transistor 405 is coupled to line IN while the source of NMOS pulldown transistor 405 is coupled to the drain of an NMOS pulldown transistor 410. The gate of NMOS pulldown transistor 410 is coupled to line SCA_L, while the source of NMOS pulldown transistor 410 is coupled to Vss.

PMOS pullup transistor 403 has line IN coupled to its gate and line IN_OUT coupled to its drain. The source of PMOS pullup transistor 403 is coupled to Vcc.

During the precharge phase of operation, the system CLK is low (resulting in a low signal being applied to the line CLK in FIG. 6) and line IN is high. In this state, the NAND gate 312 can be tri-stated by asserting a high signal on line SCA_H and a low signal on line SCA_L. As a result, PMOS transistor 406 is off, thus decoupling Vcc from line IN_OUT. In addition, NMOS transistor 410 is off due to the low signal coupled to its gate from line SCA_L. This effectively decouples Vss from line IN_OUT.

Moreover, since line IN is high during precharge, PMOS pullup transistor 403 is turned off. As a result Vcc is decoupled from a p-stack formed by PMOS pullup transistor 403. Thus, unlike conventional tri-stateable NAND gates, an additional PMOS transistor gated to line SCA_H does not need to be placed between the PMOS transistor 403 and Vcc in order to ensure that the p-stack into which line IN is connected is turned off during the tri-stating of NAND gate 312. Therefore, NAND gate 312 includes one less PMOS transistor than a conventional tri-stateable NAND gate. Correspondingly, NAND gate 312 has a smaller area and smaller power requirements than a standard tri-stateable NAND gate. Also, since the PMOS transistor 403 being driven by line IN only needs to be half the size of a corresponding PMOS transistor in a conventional tri-stateable NAND gate, the capacitative loading on line IN in NAND 312 is reduced in comparison to what would be encountered in a conventional tri-stateable NAND gate.

Figure 8:
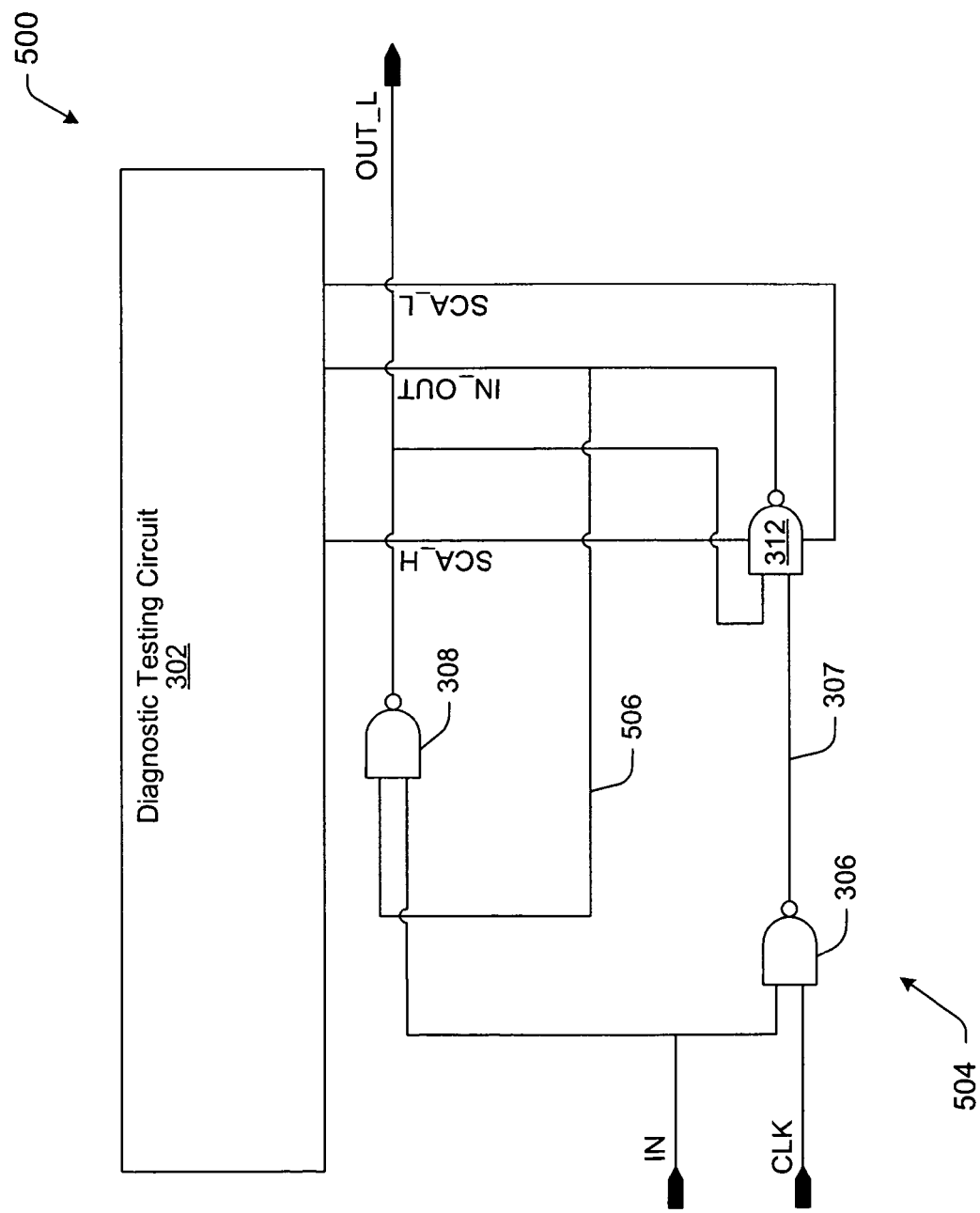
FIG. 8 shows a scanning environment for an alternate configuration of a scan-friendly domino-exit sequential.

FIG. 8 shows a scanning environment 500 including an alternate configuration of some of the circuit elements discussed in FIG. 6. Environment 500 includes the diagnostic testing circuit 302 in communication with an alternative scan-friendly domino-exit sequential for relatively small output loads 504. It will be understood that other diagnostic testing circuits besides diagnostic testing circuit 302 may be used with the alternative scan-friendly domino-exit sequential for relatively small output loads 504.

The alternative scan-friendly domino-exit sequential for relatively small output loads 504 includes gate 306, which receives a first input from a line CLK and a second input from a line IN. The output of gate 306 (i.e. node 307 in FIGS. 6 and 8) is applied to a first input of tri-stateable two input NAND gate 312. Gate 312 receives a second input from line OUT_L, and may be tri-stated by low and high signals applied, respectively, to complementary lines SCA_L and SCA_H. The output of gate 312 is applied to line IN_OUT, and a memory node 506. It will be understood, however, that gate 312 could alternately be tri-stated by a single low signal, or a single high signal.

Gate 308 receives a first input from line IN, and a second input from the output of gate 312/line IN_OUT. The output from gate 308 is applied to line OUT_L.

Similar to circuit 304 discussed above, gates 312 and 308 are cross-coupled and constitute an R-S latch memory element, since line IN_OUT couples the output of gate 312 to the second input of gate 308, and since the output of gate 308 is coupled to the second input of gate 312.

As discussed in conjunction with circuit 304 above, it will also be understood that gates 308 and 312 may be interchanged in the alternative scan-friendly domino-exit sequential for relatively small output loads 504 shown in FIG. 8, without any change in the functionality or useability of the circuit. In other words, similar functionality can be achieved regardless of which of these gates is tri-stateable. The R-S latch formed by gates 308 and 312 could also be constructed using other logic gates, such as NOR gates.

In operation, during a precharge phase, line CLK is held low, while line IN is held in precharge and is asserted high. Under these inputs, the output of gate 306 is high, and thus a high signal is applied to node 315. Thus at least one input to gate 312 and gate 308 is high. In such an instance, gate 308 and gate 312 perform as inverters, producing the complement of whatever signal is received at their second input and forming a latch.

During an evaluation phase (i.e. when a high signal is asserted to line CLK) line IN can stay high or it can be pulled low. In the event that line IN is pulled low, the value asserted on line OUT_L may immediately flip.

Circuit 504 can also operate in a scan mode. In a scan mode, diagnostic testing circuit 302 either reads data from circuit 504 or writes data to the output of circuit 504. To write data to the output, signals are communicated between the diagnostic testing circuit 302 and the circuit 504 over lines SCA_H, SCA_L and IN_OUT during the precharge phase defined by CLK (when CLK is low). More specifically, in order to write scan a value to node 506 during the scan mode, a low signal is applied to line SCA_L and a complementary high signal is applied to line SCA_H to tri-state the tri-stateable NAND gate 312. Once this occurs, the value sought to be latched may be applied to line IN_OUT. A high signal asserted on line IN_OUT will result in a high signal being placed on node 506 and a low signal being output on line OUT_L. Alternately, a low signal asserted on line IN_OUT, will result in a low signal being placed on node 506 and a high signal being output on line OUT_L. Line SCA_L may then be raised—and line SCA_H lowered—and the output node 506 will maintain its new value.

In contrast, in order to read scan from the circuit 504, the gate 312 does not need to be tri-stated. Rather the value on node 506 can be read directly into diagnostic testing circuit 302 using line IN_OUT.

Moreover, it should also be noticed that even though line IN is only one gate delay away from line OUT_L, line CLK is three gate delays away from line OUT_L. This prevents the alternative scan-friendly domino-exit sequential for relatively small output loads 504 from experiencing deleterious clock loading at line OUT_L. In addition, the omission of the look aside gate (gate 310 in FIG. 6) in the alternative scan-friendly domino-exit sequential for relatively small output loads 504 may result in smaller area and power requirements for the alternative scan-friendly domino-exit sequential for relatively small output loads 504 relative to the circuit 304.

Also, since the alternative scan-friendly domino-exit sequential for relatively small output loads 504 has the same precharge phase requirements as the circuit 304, the alternative scan-friendly domino-exit sequential for relatively small output loads 504 may utilize the tri-stateable NAND 312 gate shown in FIG. 7 above. Thus all of the benefits of the tri-stateable NAND gate 312 discussed above in conjunction with FIG. 7 may be exploited by the alternative scan-friendly domino-exit sequential for relatively small output loads 504.

Domino Entry Sequentials

Figure 9:
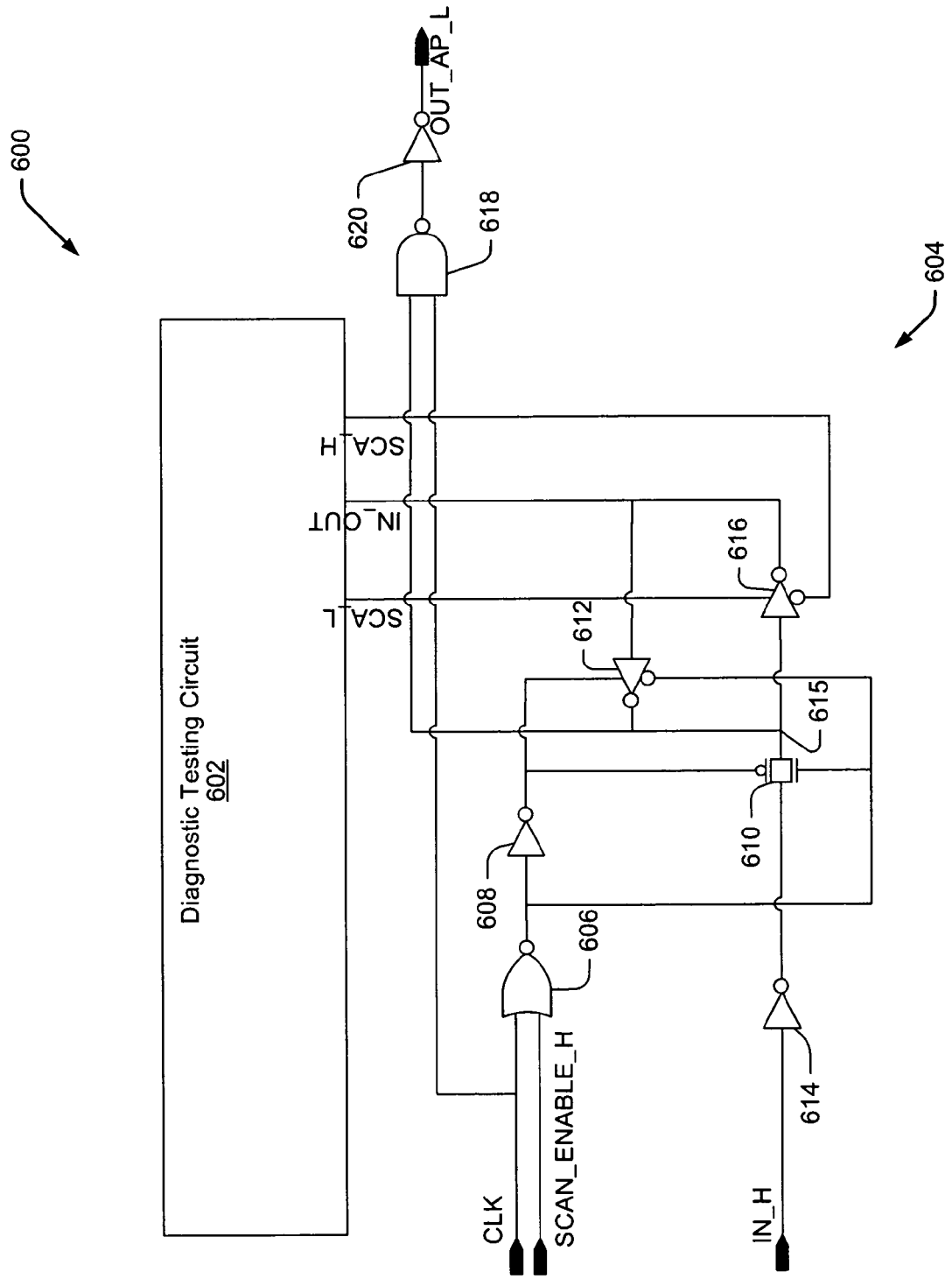
FIG. 9 shows a scanning environment for a scan-friendly domino-entry sequential for entry into A-domino logic.

FIG. 9 shows a scanning environment 600 including a diagnostic testing circuit 602 in communication with a scan-friendly domino-entry circuit 604 for entry into A-domino logic. As explained above, a domino entry circuit interfaces between static logic and domino logic, receiving a static logic signal at its input and producing signals compatible with domino logic.

In operation, the scan-friendly domino-entry circuit 604 captures a signal from static logic and latches it into a memory element. The latched value is then applied to line OUT_AP_L during an evaluation phase, when CLK is high. During a precharge phase, when line CLK goes low, a low signal is applied to line OUT_AP_L. This results in a domino-type output signal.

The scan-friendly domino-entry circuit 604 includes a two input NOR gate 606 having as its first input a line CLK and as its second input a line SCAN_ENABLE_H. The output of NOR gate 606 is coupled to the input of an inverter 608 and the NMOS gate of a pass gate 610. In addition, the output of NOR gate 606 and its complementary signal created by an inverter 608 are used to tri-state a tri-stateable inverter 612. It will be understood, however, that the tri-stateable inverter 612 could also be tri-stated by a single low signal or a single high signal. The output of inverter 608 is also coupled to the PMOS gate of pass gate 610.

A line IN_H is coupled to an input of an inverter 614. Additionally, an output of the inverter 614 is applied to a pass channel of pass gate 610. The pass channel of pass gate 610 is also coupled to a memory node 615, which itself is coupled to an input of a tri-stateable inverter 616 and an output of tri-stateable inverter 612. The memory node 615 is also coupled to an input of a two input NAND gate 618. The other input of the NAND gate 618 is provided by line CLK. The output of NAND gate 618 is coupled to the input of an inverter 620 whose output is applied to line OUT_AP_L.

The scan-friendly domino-entry circuit 604 also includes three lines from the diagnostic testing circuit 602. A line SCA_L is used in conjunction with a line SCA_H to tri-state inverter 616. It will be understood, however, that the tri-state inverter 616 could also be tri-stated by a single low signal or a single high signal. A line IN_OUT is coupled to the output of tri-stateable inverter 616 and the input of tri-stateable inverter 612.

Tri-stateable inverters 612 and 616 form a scanned latch which is followed by NAND gate 618 and inverter 620. It will be understood that implementations of sequentials may vary depending upon which phase domino logic the scan-friendly domino-entry sequential is driving into.

Figure 10:
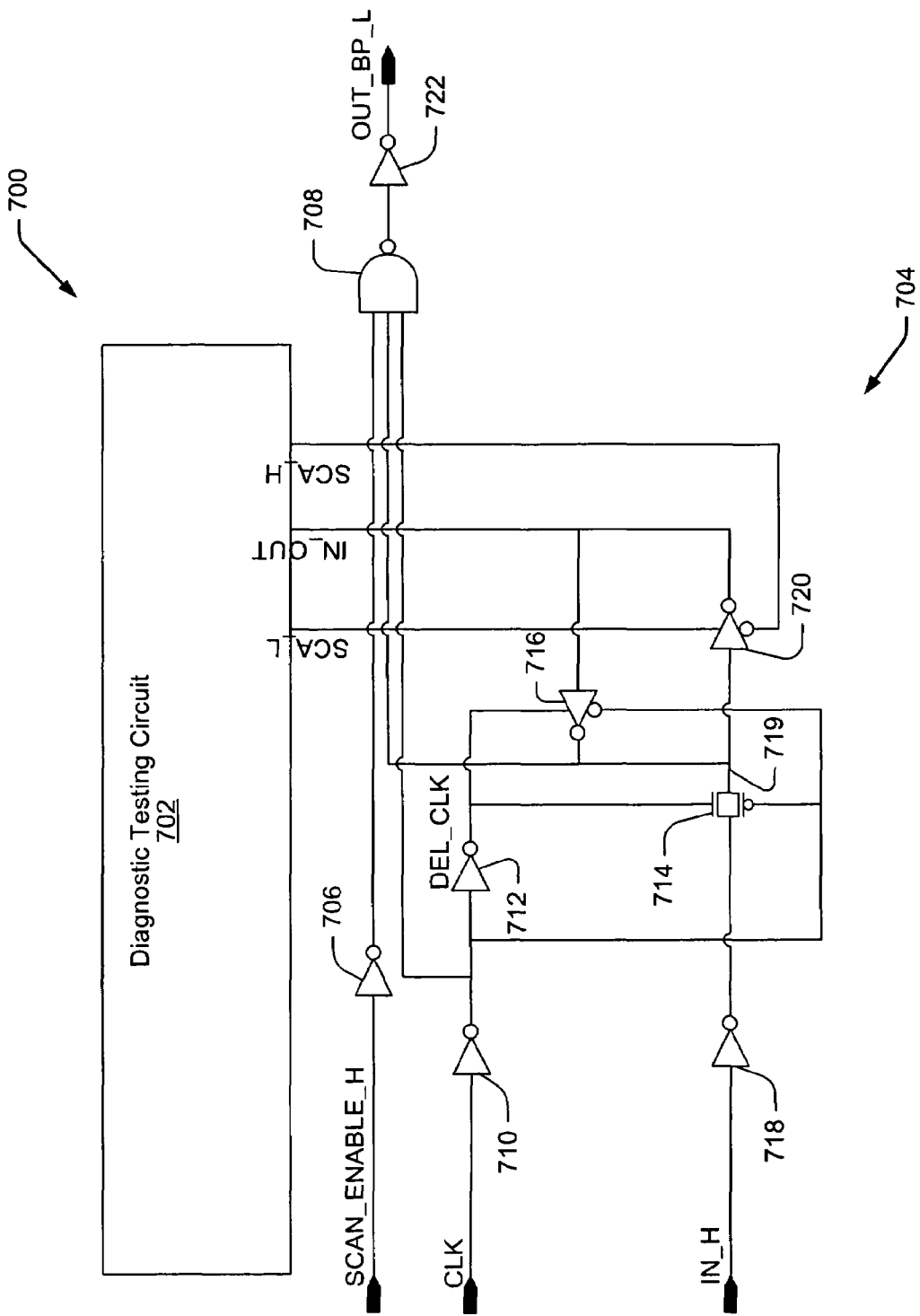
FIG. 10 shows a scanning environment for a scan-friendly domino-entry sequential for entry into B-domino logic.

As noted above, the scan-friendly domino-entry circuit 604 illustrated in FIG. 10 is configured for entry into A-domino logic (pre-charged when clock—i.e. line CLK—is low). For entry into B-domino logic (pre-charged when clock—i.e. line CLK—is high), the scan sequential may comprise a scanned latch followed by a three input NAND gate and an inverter, as will be shown and discussed in more detail in conjunction with FIG. 11. Such an additional gate in the B-domino design prevents the output from wiggling during a scan mode of operation thereby preventing potential short-circuiting between supply and ground.

The waveforms shown in Table 1 below highlight the operation of the scan-friendly domino-entry circuit 604 shown in FIG. 9. During a pre-charge phase of the domino logic into which the scan-friendly domino-entry circuit 604 is feeding, (in this case when line CLK is low), the clock signal feeding NAND gate 618 ensures that the output node (line OUT_AP_L) is pre-charged low.

In addition, the low signal on line CLK also ensures contention free scanning during a scan mode. This occurs since the low signal from line CLK and the high signal from SCAN_ENABLE_H input to NOR gate 606 result in a low signal being output from NOR gate 606. Thus the pass gate 610 is turned off and the value from line IN_H is decoupled from the memory node 615. This allows a signal on line IN_OUT to be applied to memory node 615 without any contention from line IN_H.

During an evaluate phase, when line CLK is high, data which has been latched into the latch formed by tri-stateable inverters 612, 616 is propagated to the output node through the NAND gate 618 and inverter 620. Line SCAN_ENABLE_H is held low (non-controlling input) during a normal phase of operation. During a scan mode however, this signal is asserted high to prevent random data at line IN_H from corrupting the scanned-in data at memory nodes.

TABLE 1

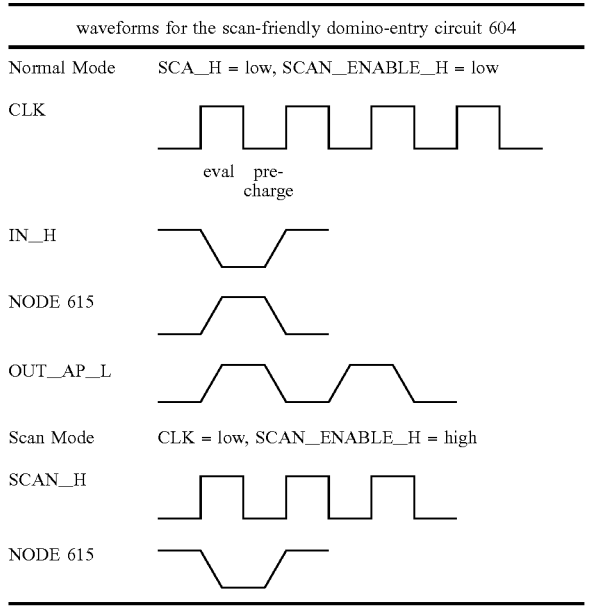

FIG. 10 shows a scanning environment 700 including a diagnostic testing circuit 702 in communication with a scan-friendly domino-entry circuit 704 for entry into B-domino logic.

In operation, the scan-friendly domino-entry circuit 704 may capture a signal from static logic and latch it into memory. The latched value may then be applied to line OU_BP_L during an evaluation phase when line CLK has a low signal applied to it. During a precharge phase, when line CLK goes high, however, a low signal may be applied to line OUT_BP_L.

The scan-friendly domino-entry circuit 704 includes a line SCAN_ENABLE_H which is coupled to an input of an inverter 706. An output of the inverter 706 is coupled to one of the inputs of a three input NAND gate 708. In addition, a line CLK is coupled to an input of an inverter 710. The output of inverter 710 is coupled to an input of the NAND gate 708, as well as being coupled to an input of an inverter 712 and the PMOS gate of a pass gate 714. The output of the inverter 712 is coupled to the NMOS gate of pass gate 714, and is used along with the output of the inverter 710 to tri-state a tri-state inverter 716. It will be understood, however, that the tri-state inverter 716 could also be tri-stated by a single low signal or a single high signal.

A line IN_H is coupled to the input of an inverter 718. The output of inverter 718 is coupled to a pass channel of pass gate 714. The pass channel of pass gate 714 is also coupled to a memory node 719, which also receives an output from tri-stateable inverter 716. Node 719 is also applied to an input of the NAND gate 708. The signal on node 719 is additionally applied to an input of a tri-stateable inverter 720 whose output is coupled to an input of the tri-stateable inverter 716, forming cross-coupled inverters 716, 720. The output of tri-stateable inverter 720 is also applied to line IN_OUT, and complementary lines SCA_L and SCA_H are used to tri-state the tri-state inverter 720. It will be understood, however, that the tri-state inverters 716, 720 could also be tri-stated by a single low signal or a single high signal.

The output of the NAND gate 708 is applied to an input of an inverter 722. An output of the inverter 722 is then applied to a line OUT_BP_L.

As noted above, the circuit 704 illustrated in FIG. 11 is configured for entry into B-domino logic (pre-charged when clock—i.e. line CLK—is high) and includes a scanned latch created by cross-coupled tri-state inverters 716, 720 followed by NAND gate 708 and inverter 722.

Table 2 shows the operation of the scannable domino-entry Sequential (B-phase) circuit 704 shown in FIG. 10. The output node (line OUT_BP_L) gets pre-charged low only when line CLK is high. When line CLK is low, the latched-in data is propagated to the output node through the NAND gate 708 and inverter 722. Since scan operation occurs only when CLK is low, the signal on line SCAN_ENABLE_H prevents the output node from wiggling during scan mode of operation, thereby avoiding possible power ground shorts in the subsequent domino logic circuitry.

Moreover, a low signal asserted on line CLK ensures contention free scanning during a scan mode. This occurs since the low signal from line CLK results in a high signal being output from inverter 710. Thus, the pass gate 714 is turned off and the value from line IN_H is decoupled from the memory node 719. This allows a signal on line IN_OUT to be applied to memory node 719 without any contention from line IN_H.

TABLE 2

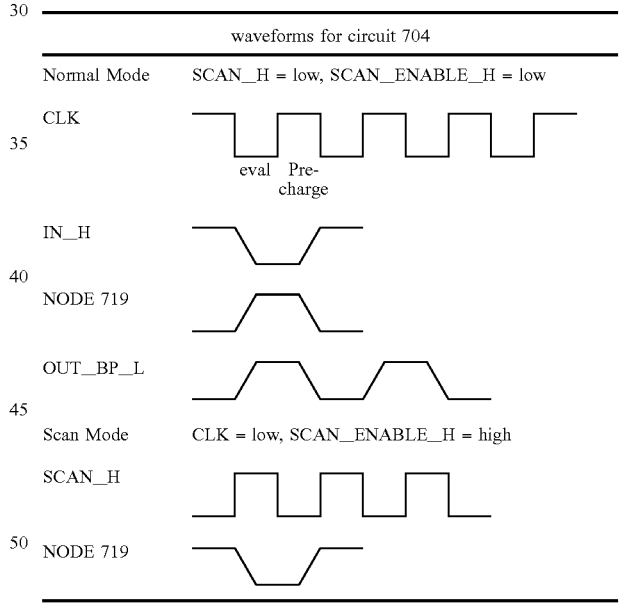

It will be understood that the diagnostic testing circuit 702 may comprise the diagnostic testing circuit 602 discussed in conjunction with FIG. 9. In general, diagnostic testing circuits 602, 702 are bolt-on modules used all across the scan sequential design on a chip. The sizing of such diagnostic testing circuits 602, 702 is relatively insensitive to the output drive ability of the scan-friendly domino-entry circuits 604, 704 and hence the diagnostic testing circuits 602, 702 may be shared across a wide variety of drive strengths on various sequential families. For example, for the smallest size single-ended domino-entry circuits, the scan area overhead may amount to approximately 35%. This may decrease to less than 10% on the largest size circuits. Furthermore, the power consumed by the diagnostic testing circuits 602, 702

(leakage power during functional phase of operation) may be less than a 1% of the total power of the sequential.

Figure 1:
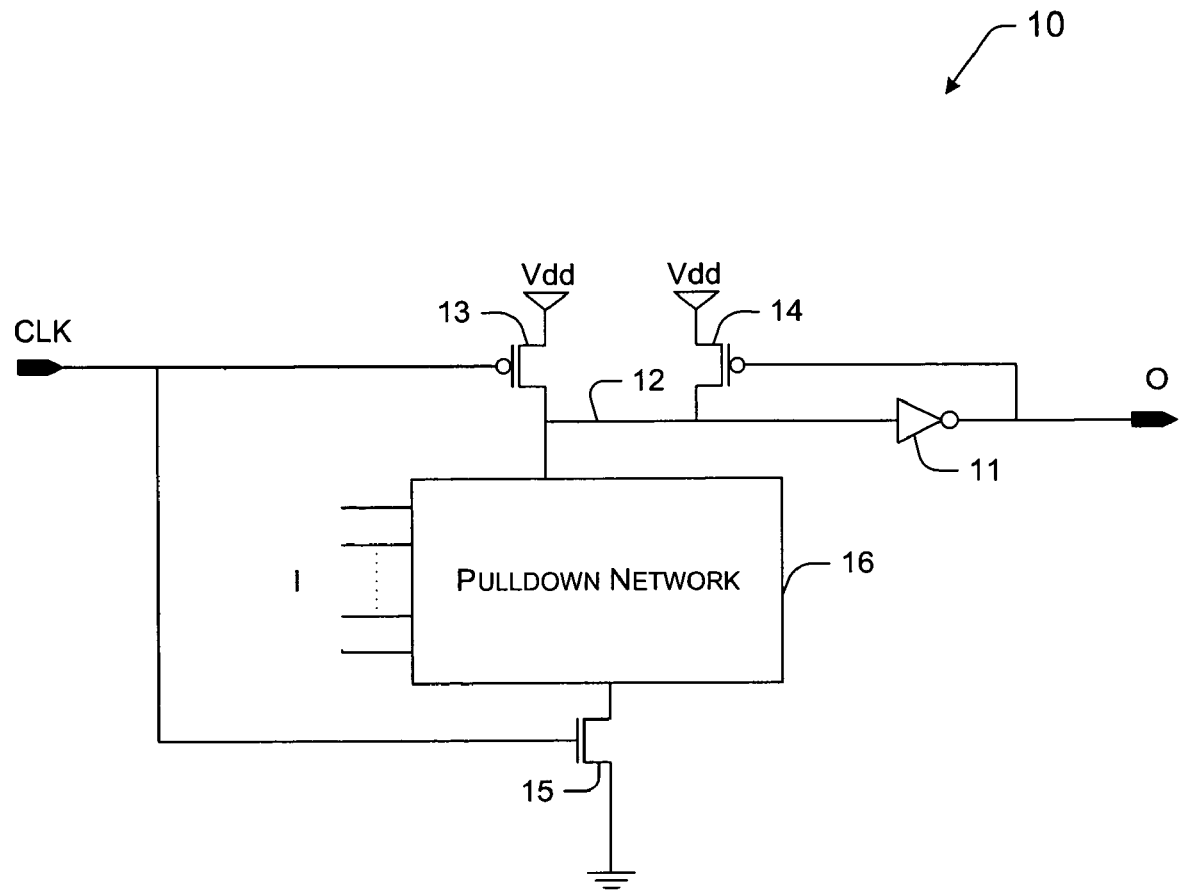
FIG. 1 illustrates a generic example of a domino logic circuit in accordance with the prior art.
Figure 2:
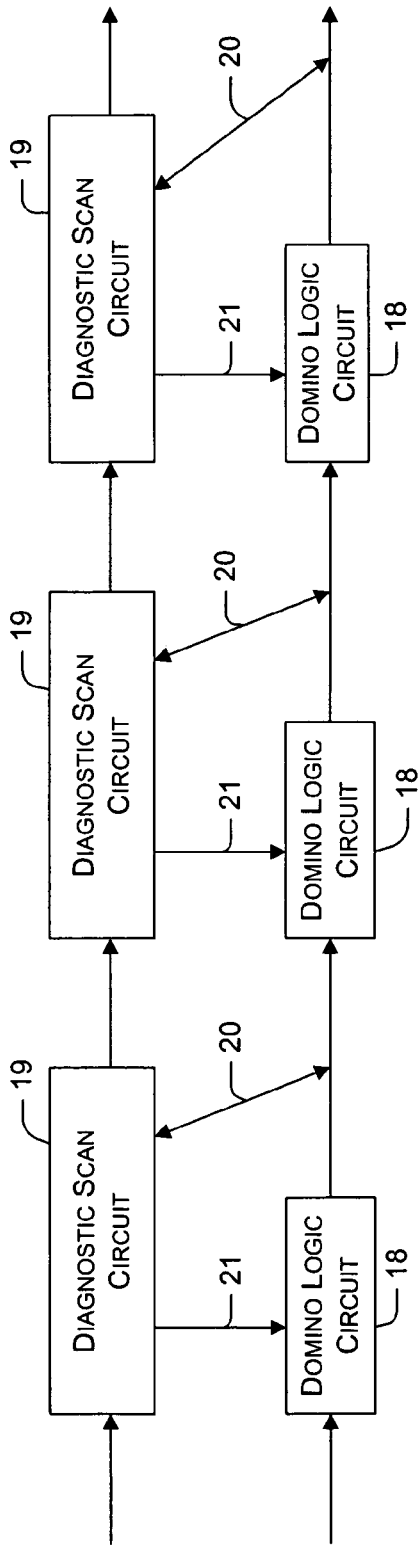
FIG. 2 illustrates an exemplary environment in which scan circuits work in conjunction with domino logic circuits.
Figure 3:
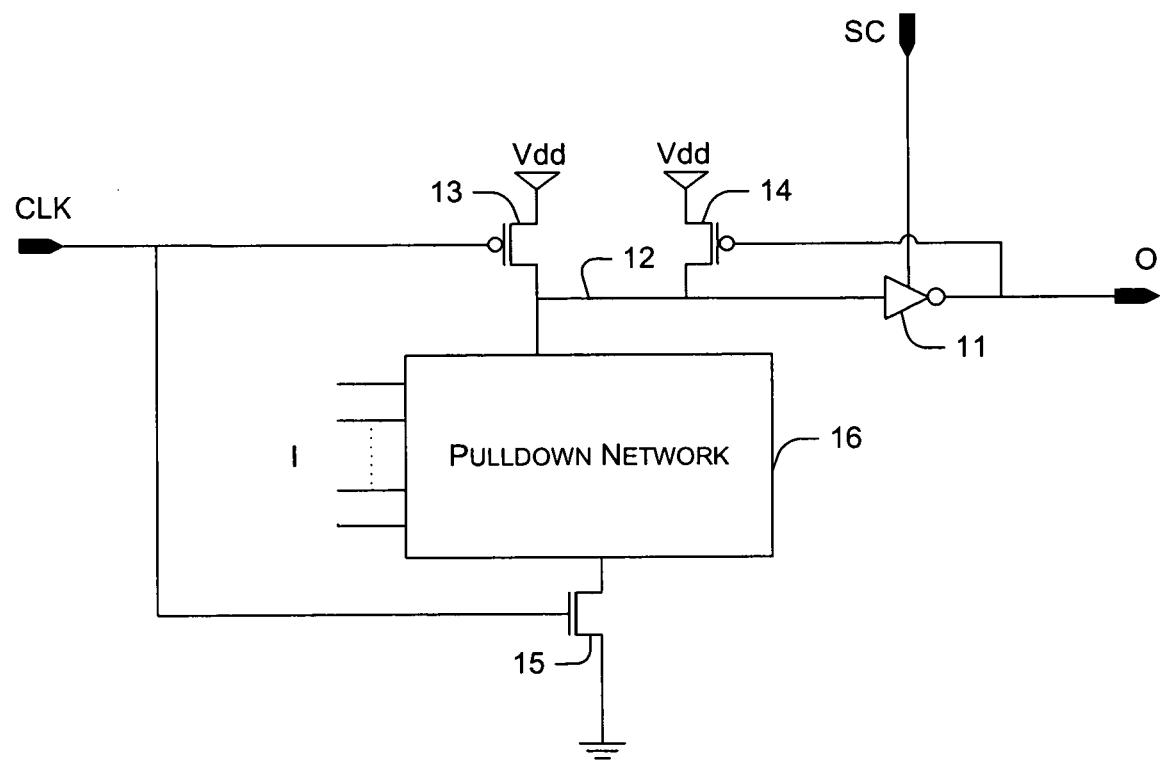
FIG. 3 illustrates the generic domino logic circuit of FIG. 1 modified for use with a scan circuit of FIG. 2.
Figure 4:
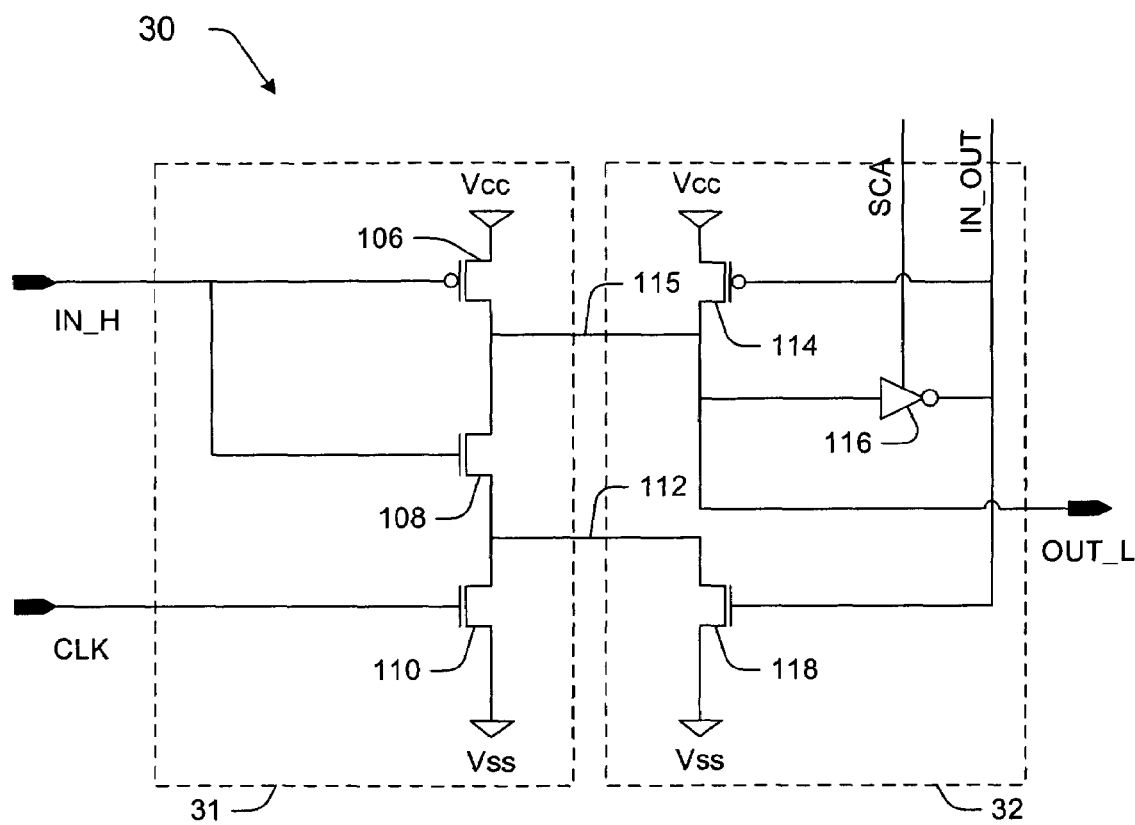
FIG. 4 illustrates a circuit for interfacing between domino logic and static logic in accordance with the prior art.
Figure 5:
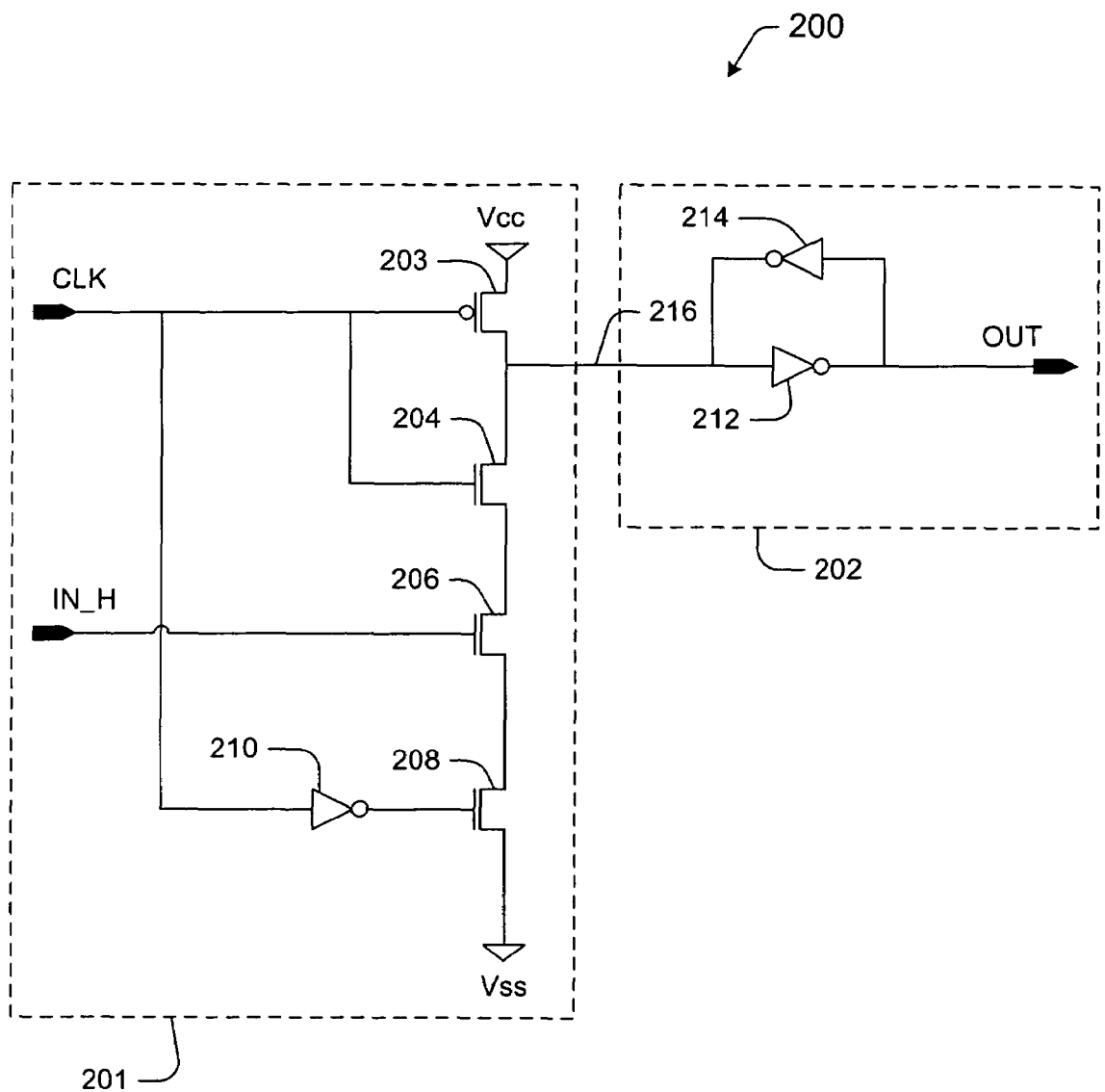
FIG. 5 illustrates a circuit for interfacing between static logic and domino logic in accordance with the prior art.

The scan-friendly domino-entry circuits 604, and 704 discussed in FIGS. 9 and 10 respectively, provide new ways of designing scan-friendly, domino-entry circuits. Besides providing an alternative to the prior art circuit shown in FIG. 2 in the non-scan mode of operation, by using the scan-friendly domino-entry circuits 604, 704 a single, small-sized diagnostic testing circuit 602, 702 can be used across a wide variety of different drive strength circuits. This is because the scan data drives into a memory node 719 that need not be sized up since NAND gates 618, 708 act as a look-aside NAND gate, taking care of output drive requirements.

CONCLUSION

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

The invention claimed is:

1. A circuit for converting received domino logic signals to a static output signal, comprising:
   a pair of logic gates having inputs and outputs that are cross-coupled;
   the logic gates being responsive to a domino logic input signal and an associated clock signal to latch the value of the domino input signal during an evaluation phase defined by the clock signal, and to produce a static output as a function of said value of the domino input signal;
   one of the pair of logic gates being responsive to a tri-state signal to tri-state its output; and
   diagnostic circuitry associated with the pair of logic gates, the diagnostic circuitry being configured to assert the tri-state signal and to establish a value at said static output during a scan mode.

2. The circuit of claim 1, further comprising a look aside logic gate configured to receive both the domino logic input signal and an output signal from one of the pair of logic gates, the look aside logic gate being further configured to drive an output line.

3. The circuit of claim 1, further comprising:
   an entry gate to force one of the pair of logic gates to output a value complementary to a value output by the other of the pair of logic gates during a precharge phase.

4. The circuit of claim 1, wherein the pair of logic gates comprises two-input NAND gates.

5. The circuit of claim 1, wherein during the precharge phase, the clock signal is pulled low and the domino logic input signal is asserted high.

6. The circuit of claim 1, wherein the tri-state signal comprises two complementary signals.

7. An apparatus comprising:
   latching logic that is responsive to a domino input signal and an associated clock signal to latch the value of the domino input signal during an evaluation phase defined by the clock signal, and to produce a static output as a function of said value of the domino input signal;
   the latching logic comprising a logic gate having first and second transistors that receive first and second inputs, respectively, the first and second transistors being connected in common to an output signal to selectively pull said output signal to a first logic level whenever either of the first and second inputs do not have a predefined logic value;
   the latching logic further comprising a first tri-state transistor that is responsive to a tri-state signal to prevent the first transistor from pulling the output signal to the first logic level;
   wherein there is no tri-state transistor associated with the second transistor to prevent the second transistor from pulling the output signal to the first logic level.

8. The apparatus of claim 7, wherein the logic gate comprises a tri-stateable NAND gate.

9. The apparatus of claim 7, wherein the first and second transistors comprise PMOS transistors.

10. The apparatus of claim 7, wherein the logic gate further comprises third and fourth transistors configured to receive the first and second inputs, respectively, the third and fourth transistors being configured to selectively pull said output signal to a second logic level whenever both of the first and second inputs have the predefined logic value.

11. The apparatus of claim 10, wherein the third and fourth transistors comprise NMOS transistors.

12. The apparatus of claim 10, wherein the third and fourth transistors are connected in series with a second tri-state transistor, the second tri-state transistor being responsive to the tri-state signal to prevent the third and fourth transistors from pulling the output signal to the second logic level.

13. The apparatus of claim 7, wherein the predefined logic value is a high value.

14. The apparatus of claim 7, wherein the first tri-state transistor is a PMOS transistor.

15. The apparatus of claim 7, wherein the latching logic comprises a pair of cross-coupled NAND gates.

16. A circuit that receives a data signal and a clock signal, comprising:
   a latch that is responsive to the clock signal to latch the value of the data signal at a predefined clock transition;
   a conversion circuit that produces a domino logic output signal in response to the clock signal and the latched value of the data signal;
   diagnostic circuitry;
   the latch having a tri-stateable component that is tri-stateable by the diagnostic circuitry, the diagnostic circuitry being connected to the output of said tri-stateable component to establish a value at said output when said tri-stateable component is tri-stated.

17. The circuit of claim 16, wherein the latch is responsive to a low to high clock transition.

18. The circuit of claim 16, wherein the latch comprises two tri-stateable inverters.

19. The circuit of claim 16, wherein the conversion circuit comprises a look aside NAND gate having an output coupled to an inverter.

20. The circuit of claim 19, wherein the look aside NAND gate has three inputs, wherein the third input is received from a scan enable line.

21. The circuit of claim 16, further comprising a non contention element responsive to the clock signal and a scan enable signal to tri-state an input line from the latch.

22. The circuit of claim 16, wherein the latch receives a scan enable signal that prevents the latch from latching the value of the data signal.

23. A circuit for converting a received static logic signal into domino logic signals comprising:

a latch that is responsive to a clock signal to latch a value of a data signal at a data node at a predefined clock transition;

a conversion circuit that produces a domino logic output signal in response to the clock signal, and the latched value of the data signal;

diagnostic circuitry;

the latch having a first tri-stateable component that is tri-stateable by the diagnostic circuitry, the diagnostic circuitry being connected to the output of said first tri-stateable component to establish a value at said output when said first tri-stateable component is tri-stated, the latch further having a second tri-stateable component that is tri-stateable by the clock signal, the output of the second tri-stateable component being connected to the data node.

24. The circuit of claim 23, wherein the latch is responsive to a high to low clock transition.

25. The circuit of claim 23, wherein the latch comprises two tri-stateable inverters.

26. The circuit of claim 23, wherein the conversion circuit comprises a look aside NAND gate having an output coupled to an inverter.

27. The circuit of claim 26, wherein the look aside NAND gate has three inputs, wherein a third input is configured to receive a scan enable signal.

28. The circuit of claim 23, further comprising a non contention element responsive to the clock signal to tri-state an input line from the latch.

29. The circuit of claim 23, wherein the latch receives a scan enable signal that prevents the latch from latching the value of the data signal.

* * * * *